United States Patent
Lee et al.

(10) Patent No.: US 11,844,288 B2
(45) Date of Patent: Dec. 12, 2023

(54) IN-PLANE MAGNETIZED SPIN-ORBIT MAGNETIC DEVICE

(71) Applicant: Industrial Technology Research Institute, Hsinchu (TW)

(72) Inventors: Hsin-Han Lee, Hsinchu (TW); Jeng-Hua Wei, Taipei (TW); I-Jung Wang, Hsinchu County (TW); Shan-Yi Yang, Hsinchu (TW); Yao-Jen Chang, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 360 days.

(21) Appl. No.: 17/168,146

(22) Filed: Feb. 4, 2021

(65) Prior Publication Data

US 2022/0109100 A1   Apr. 7, 2022

(30) Foreign Application Priority Data

Oct. 7, 2020   (TW) .................. 109134728

(51) Int. Cl.
*H10N 52/80*   (2023.01)
*H10N 50/85*   (2023.01)
(Continued)

(52) U.S. Cl.
CPC ............. *H10N 52/80* (2023.02); *H10N 50/85* (2023.02); *H10N 52/00* (2023.02); *H10B 61/00* (2023.02)

(58) Field of Classification Search
CPC ........ H10N 52/80; H10N 52/00; H10N 50/85; H10N 52/85; H10N 59/00; H10N 50/00; H10B 61/00; H10B 61/20
See application file for complete search history.

(56) References Cited

U.S. PATENT DOCUMENTS

| 9,608,039 B1 | 3/2017 | Apalkov et al. |
| 9,747,933 B1 | 8/2017 | Watanabe et al. |

(Continued)

FOREIGN PATENT DOCUMENTS

| CN | 110447074 | 11/2019 |
| TW | 201805944 | 2/2018 |

OTHER PUBLICATIONS

Ioan Mihai Miron, et al., "Perpendicular switching of a single ferromagnetic layer induced by in-plane current injection", Nature vol. 476, Aug. 11, 2011, pp. 189-193.

(Continued)

*Primary Examiner* — Latanya N Crawford Eason
(74) *Attorney, Agent, or Firm* — JCIPRNET

(57) ABSTRACT

An in-plane magnetized spin-orbit magnetic device is provided. The in-plane magnetized spin-orbit magnetic device includes a heavy metal layer, an upper electrode and a magnetic tunnel junction. The magnetic tunnel junction is disposed between the heavy metal layer and the upper electrode. The magnetic tunnel junction includes a free layer and a pinned layer. The free layer is disposed on the heavy metal layer, and the free layer has a first film plane area. The pinned layer is disposed on the free layer, and the pinned layer has a second film plane area. There is a preset angle between a long axis direction of a film plane shape of the free layer and a long axis direction of a film plane shape of the pinned layer, and the first film plane area is larger than the second film plane area.

16 Claims, 11 Drawing Sheets

(51) Int. Cl.
H10N 52/00 (2023.01)
H10B 61/00 (2023.01)

(56) References Cited

U.S. PATENT DOCUMENTS

| | | |
|---|---|---|
| 10,205,092 B2 | 2/2019 | Chepulskyy et al. |
| 10,333,058 B2 | 6/2019 | Aradhya et al. |
| 2007/0063237 A1 | 3/2007 | Huai et al. |
| 2017/0179372 A1 | 6/2017 | Braganca |
| 2019/0123265 A1 | 4/2019 | Lee et al. |
| 2020/0058847 A1 | 2/2020 | Lee et al. |
| 2021/0020827 A1* | 1/2021 | Shakh ............ H01F 10/30 |

OTHER PUBLICATIONS

Luqiao Liu, et al., "Current-Induced Switching of Perpendicularly Magnetized Magnetic Layers Using Spin Torque from the Spin Hall Effect", Physical Review Letters 109, 096602, Aug. 29, 2012, pp. 096602-1-096602-5.

Ki-Seung Lee, et al., "Threshold current for switching of a perpendicular magnetic layer induced by spin Hall effect", Appl. Phys. Lett. 102, 112410, Mar. 11, 2013, pp. 112410-112410-5.

Sasikanth Manipatruni, et al., "Energy-delay performance of giant spin Hall effect switching for dense magnetic memory", Appl. Phys. Express 7, Aug. 10, 2014, pp. 103001-1-103001-4.

"Notice of allowance of Taiwan Counterpart Application", dated Sep. 3, 2021, p. 1-p. 3.

* cited by examiner

IN-PLANE MAGNETIZED SPIN-ORBIT MAGNETIC DEVICE

CROSS-REFERENCE TO RELATED APPLICATION

This application claims the priority benefit of Taiwan application serial no. 109134728, filed on Oct. 7, 2020. The entirety of the above-mentioned patent application is hereby incorporated by reference herein and made a part of this specification.

BACKGROUND

Technical Field

The disclosure relates to an in-plane magnetized spin-orbit magnetic device.

Description of Related Art

Magnetic Random Access Memory (MRAM) has the advantages of fast speed, low energy consumption, high density, non-volatility, and almost an unlimited number of times of reading and writing, based on which MRAM is predicted to be a mainstream next-generation memory. The main structure of a memory device in a magnetic memory is a stacked structure formed by a pinned layer with three layers of materials including ferromagnetic/nonmagnetic metal/ferromagnetic materials, a tunneling barrier layer, and a free layer of magnetic materials. Such a stacked structure is called a magnetic tunnel junction (MTJ) device. Since a write current only passes through an MTJ device that is selected, and since a magnetization reversal occurs based on the intensity of the write current and the intensity of an external magnetic field, miniaturizing the MTJ device is beneficial to decreasing the write current, theoretically increasing write selectivity and decreasing the write current.

MTJ devices that read and write based on a spin-orbit-torque (SOT) mechanism include in-plane MTJ devices and perpendicular MTJ devices. An MRAM's operation speed and write reliability may be increased if the MRAM structure is realized through utilizing the SOT mechanism. A reversal mechanism of the SOT in an in-plane MTJ device is to insert a write current into a heavy metal layer including ferromagnetic materials. The heavy metal layer generates a spin transfer torque (STT) due to the spin Hall Effect and the external magnetic field. In addition, the write current generates a Rashba torque (RT) after the write current passes through a vertical electric field and the external magnetic field where the materials interface with each other. Since the two torques, STT and RT, are both perpendicular to the direction of the write current and parallel to a film plane, these two torques add up and become an SOT. The SOT is generated through applying the magnetic field to the ferromagnetic materials on a film plane perpendicular to a magnetic torque, and the SOT enables the magnetic torque of a ferromagnetic layer to undergo a magnetization reversal, thus achieving the purpose of writing into a memory device.

SUMMARY

An in-plane magnetized spin-orbit magnetic device in an embodiment of the disclosure includes a heavy metal layer, an upper electrode, and a magnetic tunnel junction. The magnetic tunnel junction is disposed between the heavy metal layer and the upper electrode. The magnetic tunnel junction includes a free layer and a pinned layer. The free layer is disposed on the heavy metal layer, and the free layer has a first film plane area. The pinned layer is disposed on the free layer, and the pinned layer has a second film plane area. A preset angle is present between a long axis direction of the film plane shape of the free layer and a long axis direction of the film plane shape of the pinned layer, and the first film plane area is larger than the second film plane area.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

In the embodiments of the disclosure, film plane shapes of a free layer and a pinned layer in a magnetic tunnel junction and the corresponding structure are designed so that a magnetic torque of the free layer in each embodiment of the disclosure is more susceptible to a magnetization reversal due to a spin-orbit torque caused by a current of a heavy metal layer. Details of each embodiment are described below.

Figure 1A:
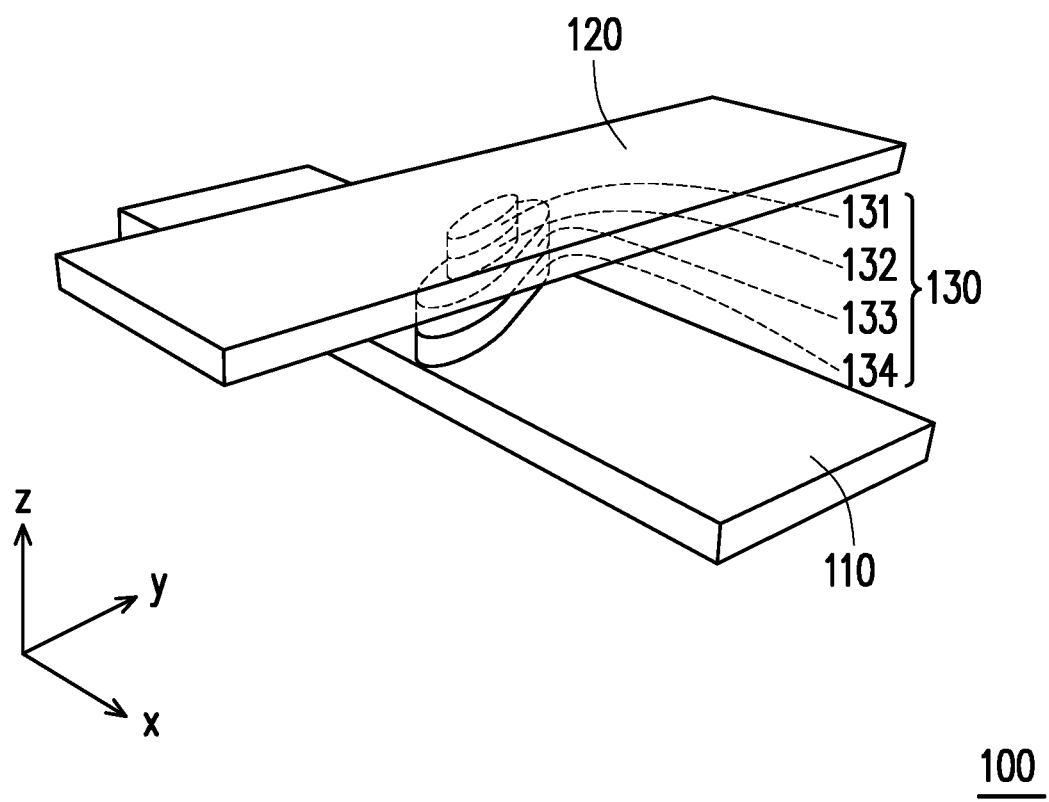
FIG. 1A is a schematic view of a structure of an in-plane magnetized spin-orbit magnetic device according to a first embodiment of the disclosure.
Figure 1B:
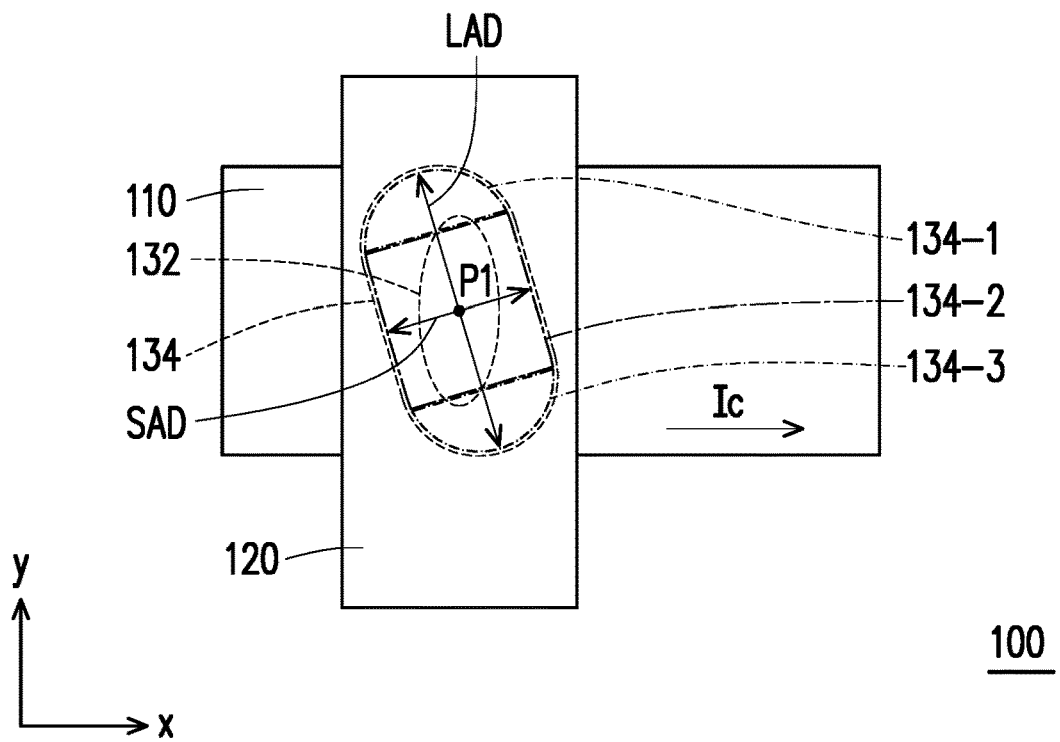
FIG. 1B is a top view of the structure of the in-plane magnetized spin-orbit magnetic device in FIG. 1A.
Figure 1C:
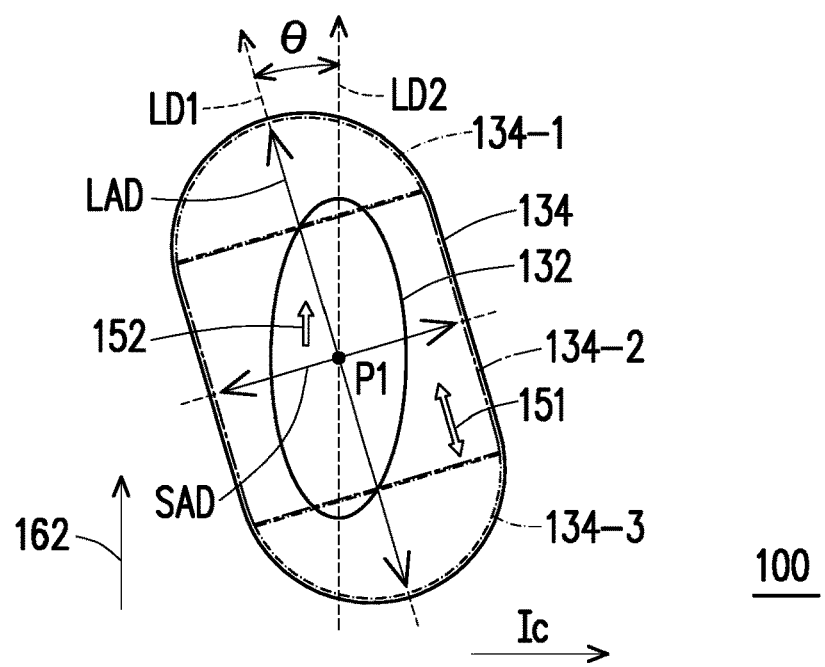
FIG. 1C is a schematic view of film plane shapes of a pinned layer and a free layer in FIG. 1A.
Figure 2:
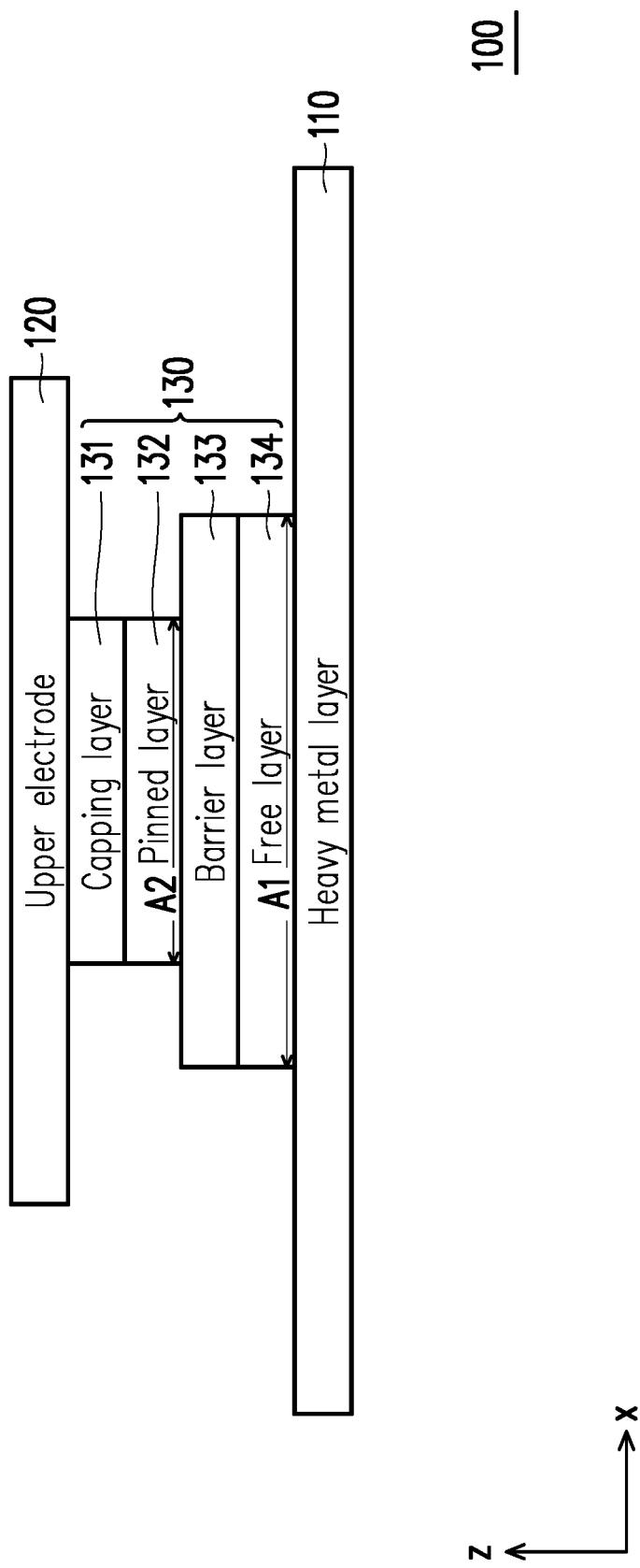
FIG. 2 is a side view of the structure of the in-plane magnetized spin-orbit magnetic device according to the first embodiment and a second embodiment of the disclosure.

FIG. 1A is a schematic view of a structure of an in-plane magnetized spin-orbit magnetic device 100 according to a first embodiment of the disclosure. FIG. 1B is a top view of the structure of the in-plane magnetized spin-orbit magnetic device 100 in FIG. 1A. FIG. 1C is a schematic view of film plane shapes of a pinned layer 132 and a free layer 134 in FIG. 1A. FIG. 2 is a side view of the structure of the in-plane magnetized spin-orbit magnetic device 100 according to the first embodiment and a second embodiment of the disclosure. The first embodiment of the disclosure is described below with FIGS. 1A to 1C and FIG. 2.

The in-plane magnetized spin-orbit magnetic device 100 mainly includes a heavy metal layer 110, an upper electrode 120, and a magnetic tunnel junction 130. The magnetic tunnel junction 130 is disposed between the heavy metal layer 110 and the upper electrode 120. The magnetic tunnel junction 130 mainly includes the free layer 134 and the pinned layer 132.

The heavy metal layer 110 is also referred to as a write wire. The heavy metal layer 110 obtains an input current Ic through an electrode contact to generate a spin current, so that the magnetic tunnel junction 130 undergoes a magnetization reversal. A material of the heavy metal layer 110 in this embodiment may be tantalum (Ta), platinum (Pt), tungsten (W), or an alloy of a combination of Ta, Pt, and W.

The upper electrode 120 is also referred to as a bit wire, and is used to read data stored in the magnetic tunnel junction 130 in the in-plane magnetized spin-orbit magnetic device 100. A material of the upper electrode 120 may be a conductive material such as copper (Cu), aluminum (Al), tantalum (Ta), or an alloy of a combination of Cu, Al, and Ta.

The free layer 134 is disposed on the heavy metal layer 110. The pinned layer 132 is disposed on the free layer 134. A material of the pinned layer 132 is a ferromagnetic material with an in-plane magnetic torque, and a magnetic torque vector 152 of the pinned layer 132 is in an arrangement parallel to the film plane. A material of the pinned layer 132 may be iron (Fe), cobalt (Co), nickel (Ni), gadolinium (Gd), terbium (Tb), dysprosium (Dy), boron (B), or an alloy of a combination of Fe, Co, Ni, Gd, Tb, Dy, and B. Specifically, an example is given in which the pinned layer 132 is a stacked layer of ferromagnetic/nonmagnetic metal/ferromagnetic materials including a lower pinned layer, a coupling layer, and an upper pinned layer. The upper pinned layer and the lower pinned layer may be a single-layer structure or a multilayer composite structure. The upper pinned layer or the lower pinned layer of the single-layer structure is realized by a ferromagnetic material such as Fe, Co, or Ni, etc., or an alloy of Fe, Co, or Ni, etc. The upper pinned layer or the lower pinned layer of the multilayer composite structure may be a composite layer structure of a ferromagnetic material and a metal material, such as a composite layer structure formed by cobalt (Co)/platinum (Pt), cobalt (Co)/nickel (Ni), or cobalt (Co)/palladium (Pd), etc.

The free layer 134 is a memory layer in the in-plane magnetized spin-orbit magnetic device 100. The heavy metal layer 110 receives the input current Ic from the electrode contact of the in-plane magnetized spin-orbit magnetic device 100. The input current Ic flows through the heavy metal layer 110 to generate multiple spin currents towards different directions due to the spin Hall effect (SHE), thereby further generating a resultant torque with an external magnetic field to reverse the magnetic torque of the free layer 134, and thus achieving data reading and writing. A material of the free layer 134 is a ferromagnetic material with horizontal anisotropy. The magnetic torque of the free layer 134 is determined by the shape of the free layer; that is, a direction of the magnetic torque of the free layer is determined by the direction of a long axis of the shape of the free layer, and a magnetic torque vector of the free layer is in an arrangement parallel to the film plane. A ferromagnetic material of the free layer 134 may be iron (Fe), cobalt (Co), nickel (Ni), gadolinium (Gd), terbium (Tb), dysprosium (Dy), boron (B), or an alloy of Fe, Co, Ni, Gd, Tb, Dy, or B, such as CoFeB, NF, and FeB, etc. The free layer 134 is a single-layer structure or a multilayer composite structure. If the free layer is a composite structure formed by a plurality of layers of a ferromagnetic material, a material of the multilayer composite structure may be a composite layer structure formed by elements such as cobalt (Co)/platinum (Pt), cobalt (Co)/nickel (Ni), or cobalt (Co)/palladium (Pd), etc.

The magnetic tunnel junction 130 of this embodiment further includes a capping layer 131 and a barrier layer 133. The capping layer 131 is disposed between the upper electrode 120 and the pinned layer 132. The barrier layer 133 is disposed between the free layer 134 and the pinned layer 132. The barrier layer 133 may have a preset thickness obtained through experiments to effectively prevent a spin current transfer between the metal or ferromagnetic materials of the upper and lower layers, so that the operation mechanisms of the respective layers remain simple and do not affect each other. The barrier layer 133 of this embodiment may be an insulating material having a magnetic tunnel condition under a specified thickness. The insulating material may be magnesium oxide, aluminum oxide, or a combination of magnesium oxide and aluminum oxide. The capping layer 131 and the pinned layer 132 of this embodiment have a same film plane shape and film plane area, and the barrier layer 133 and the free layer 134 have a same film plane shape and film plane area, as shown in FIG. 1A.

For the ease of description, a Cartesian coordinate system is defined in the drawings of the embodiments of the disclosure. The X-axis direction in FIGS. 1B and 1C is the extending direction of the heavy metal layer 110. The Y-axis direction is the extending direction of the upper electrode 120. The plane formed by the X-axis direction and the Y-axis direction is the film plane of each layer, such as the upper electrode 120, the heavy metal layer 110, the pinned layer 132, and the free layer 134. The Z-axis direction is a direction perpendicular to the film plane. The film plane of each of the layers is parallel to the X-Y plane. In this embodiment, the transmission direction of the input current Ic is the positive X-axis direction.

The locations and the film plane shapes of the pinned layer 132 and the free layer 134 are respectively shown in FIGS. 1B and 1C. In this embodiment, the film plane shapes of the free layer 134 and the pinned layer 132 in the magnetic tunnel junction 130 and the corresponding structure are specifically designed, so that the magnetic torque of the free layer in each embodiment of the disclosure is more susceptible to the magnetization reversal due to the spin-orbit torque caused by the current of the heavy metal layer. Specifically, the film plane shape of the free layer 134 in this embodiment is either an ellipse or a capsule shape, and the film plane shape of the pinned layer 132 is an ellipse. The ellipse and the capsule shape both have a long axis and a short axis.

The "capsule shape" is described in detail hereafter. The film plane shape of the free layer 134 is shown in FIG. 1B and FIG. 1C as a capsule shape. In this embodiment, the capsule shape of the free layer 134 is a combination of two semicircles 134-1 and 134-3 and a rectangle 134-2. In the embodiment of the disclosure, a connecting line between the two points with a longest distance in the capsule shape of the free layer 134 is referred to as a long axis LAD of the capsule shape, and the long axis LAD passes through the center point of the rectangle 134-2 of the capsule shape (that is, a center point P1 of the film plane shape of the free layer). On the other hand, in this embodiment, a connecting line that passes through the center point of the rectangle 134-2 of the capsule shape (i.e., the center point P1 of the film plane shape of the free layer), and is parallel to the sides where the semicircle 134-1 or 134-3 and the rectangle 134-2 are connected with each other to each other is referred to as a short axis SAD of the capsule shape. In other words, the long axis LAD and the short axis SAD of the capsule shape both pass through the center point P1 of the film plane shape of the free layer. A direction corresponding to the long axis LAD is a long axis direction LD1 in FIG. 1C.

The length of the long axis LAD in this embodiment may be the length of the diameter of the semicircle 134-1 or 134-3 plus the length of a side of the rectangle 134-2 that is not connected with the semicircle 134-1 or 134-3, such as the long side of the rectangle 134-2 in FIG. 1B and FIG. 1C. The length of the short axis SAD in this embodiment may be the length of the diameter of the semicircle 134-1 or 134-3.

The capsule shape in this embodiment is formed by combining the semicircles 134-1 and 134-3 and the rectangle 134-2. However, in other embodiments, a capsule shape may also be formed by combining two semi-ellipses and a rectangle. For a capsule shape combining two semi-ellipses and a rectangle, the length of the long axis of the capsule shape is the lengths of the long axes of the two semi-ellipses plus the length of a side of the rectangle not connected with the two semi-ellipses. The length of the short axis of this capsule shape is the length of the short axis of the two semi-ellipses.

In this embodiment, the free layer 134 has a first film plane area A1, the pinned layer 132 has a second film plane area A2, and the first film plane area A1 is larger than the second film plane area A2. In this embodiment, the center point of the film plane shape of the free layer and the center point (e.g., the center point P1 of FIG. 1C) of the film plane shape of the pinned layer may overlap. However, for those applying the embodiment, the center point of the film plane shape of the free layer may also be set as different from the center point of the film plane shape of the pinned layer.

By design, a preset angle θ is present between the long axis direction LD1 of the film plane shape of the free layer 134 and a long axis direction LD2 of the film plane shape of the pinned layer 132 of this embodiment. In this way, the spin-orbit torque provides an additional lateral torque to a magnetic torque vector 151 of the free layer 134, thereby slightly reducing the difficulty of the magnetization reversal of the magnetic torque of the free layer 134. In this embodiment, the absolute value of the preset angle θ may be greater than zero degree and less than 45 degrees. If the absolute value of the preset angle θ is greater than 45 degrees, the additional lateral torque provided by the spin-orbit torque is less salient, causing the magnetization reversal of the free layer to be less stable. In other words, if the absolute value of the preset angle θ is greater than 45 degrees, an unexpected magnetization reversal of the free layer may occur. The preset angle in this embodiment is not equal to 0 degrees and 90 degrees.

In this embodiment, the direction of the magnetic torque vector 152 of the pinned layer 132 is to the same as the long axis direction LD2 of the film plane shape of the free layer 132. In this embodiment, when annealing is performed on the pinned layer 132 in the semiconductor manufacturing process of the in-plane magnetized spin-orbit magnetic device 100, the embodiment is designed to set an anneal direction 162 along the long axis direction LD2 of the film plane shape of the free layer 132, and the direction of the magnetic torque vector 152 of the pinned layer 132 is thus determined/pinned. Specifically, the workflow of manufacturing an in-plane magnetized spin-orbit magnetic device or a related magnetic random access memory (MRAM) using a semiconductor manufacturing process is outlined as follows. The steps in the process include coating a substrate by performing a physical vapor deposition (PVD) process, performing field anneal, applying a mask or patterning, and etching, etc., and the sequence of carrying out these steps is variable and not limited to the above. After the steps are completed, the substrate undergoes device testing and encapsulation, after which the manufacturing of the in-plane magnetized spin-orbit magnetic device 100 is completed. The anneal direction described in this embodiment is the direction of the magnetic torque vector of a component of a certain layer pinned by, for example, heating, cooling the substrate at a specific temperature in the field anneal step in the semiconductor manufacturing process.

In the first embodiment, the capping layer 131 and the pinned layer 132 are etched at the same time during the semiconductor process, while the barrier layer 133 and the free layer 134 are etched at the same time at another time in the semiconductor process. Therefore, the capping layer 131 and the pinned layer 132 have a same film plane shape, and the barrier layer 133 and the free layer 134 have a same film plane shape. The film plane shapes of the capping layer 131 and the pinned layer 132 are different from the film plane shapes of the free layer 134 and the barrier layer 133. In the etching step of the semiconductor manufacturing process of this embodiment, if the barrier layer 133, the capping layer 131, and the pinned layer 132 are etched at the same time, a portion of the free layer 134 is not covered by the barrier layer 133 and is thus exposed. As a result, the portion of the free layer 134 not covered by the barrier layer 133 may lose its magnetism. This way, the free layer 134 may not provide the additional reversal torque due to shape anisotropy. Therefore, in order to avoid the aforementioned situation, in this embodiment, the barrier layer 133 and the free layer 134 are etched at the same time, so that the barrier layer 133 and the free layer 134 have the same film plane shape.

Figure 3A:
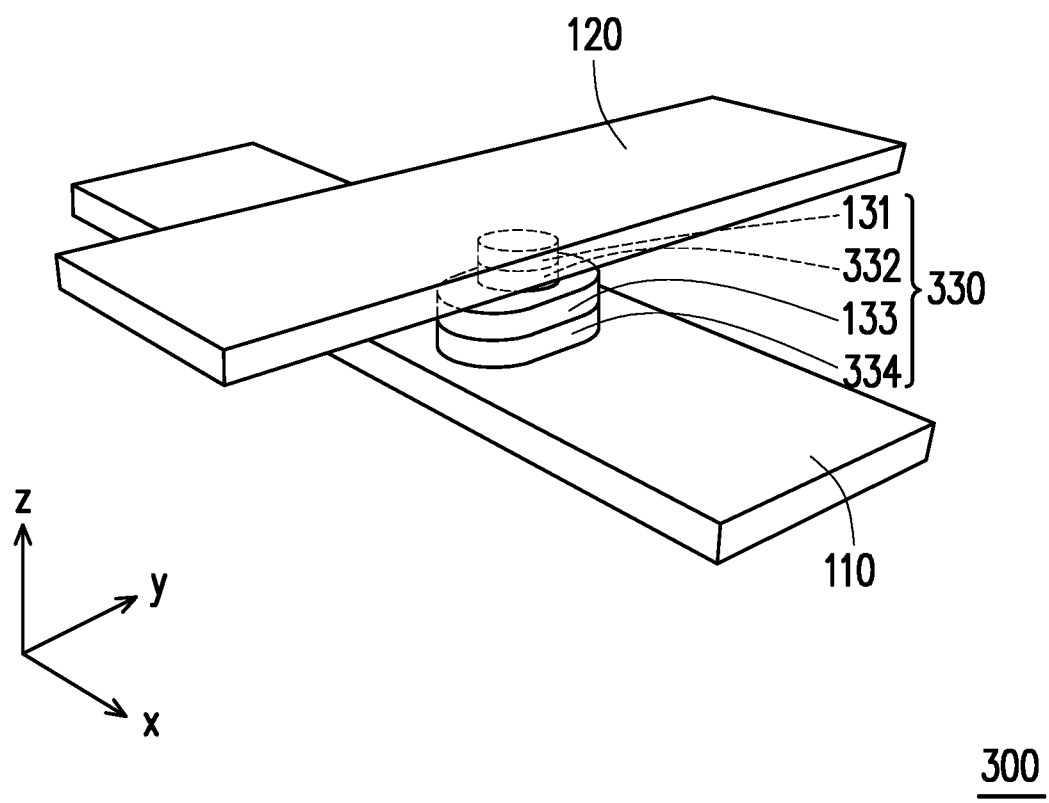
FIG. 3A is a schematic view of the structure of the in-plane magnetized spin-orbit magnetic device according to the second embodiment of the disclosure.
Figure 3B:
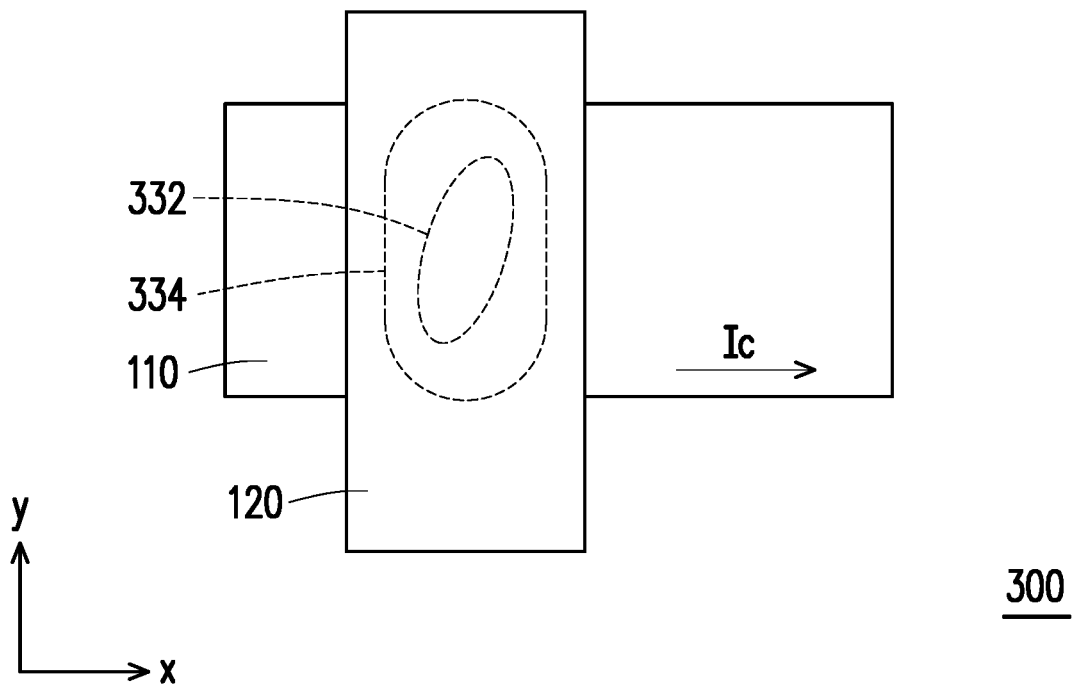
FIG. 3B is a top view of the structure of the in-plane magnetized spin-orbit magnetic device in FIG. 3A.
Figure 3C:
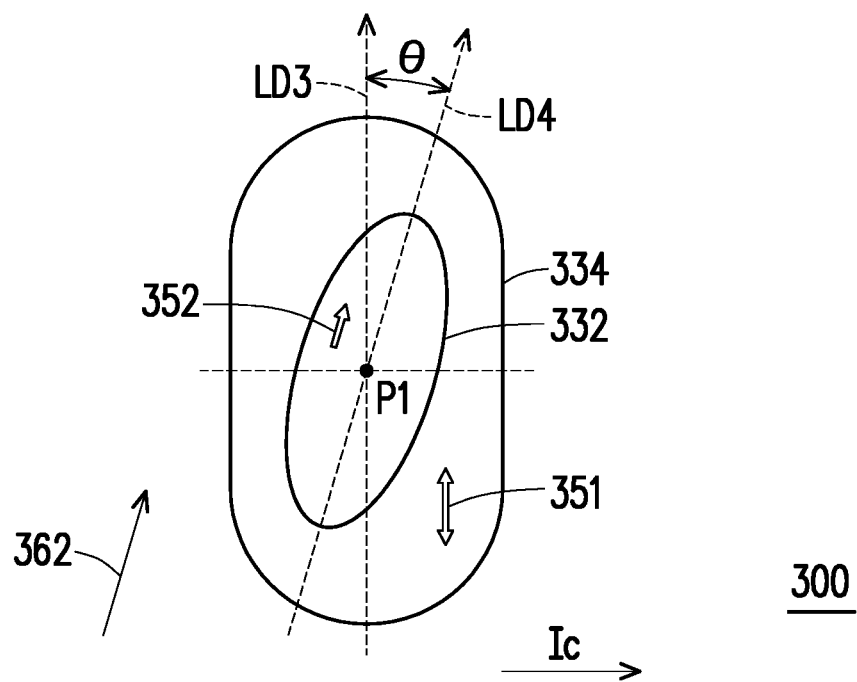
FIG. 3C is a schematic view of film plane shapes of a pinned layer and a free layer in FIG. 3A.

The second embodiment of the disclosure is described in the following with reference of FIG. 2 and FIGS. 3A to 3C. Each of the layers in the in-plane magnetized spin-orbit magnetic device 100 of the first embodiment and an in-plane magnetized spin-orbit magnetic device 300 of the second embodiment have a same structure in the side view. Therefore, FIG. 2 is used again as the side view of the in-plane magnetized spin-orbit magnetic device 300. FIG. 3A is a schematic view of a structure of the in-plane magnetized spin-orbit magnetic device 300 according to the second embodiment of the disclosure. FIG. 3B is a top view of a structure of the in-plane magnetized spin-orbit magnetic device 300 in FIG. 3A. FIG. 3C is a schematic view of film plane shapes of a pinned layer 332 and a free layer 334 in FIG. 3A.

Materials and functions of components of the respective layers in the first embodiment and the second embodiment are the same. The second embodiment differs from the first embodiment in that in the in-plane magnetized spin-orbit magnetic device 300, the locations of the free layer 334 and the pinned layer 332 are arranged to be different from the locations of the free layer 134 and the pinned layer 132 in the in-plane magnetized spin-orbit magnetic device 100. In particular, in the second embodiment, a long axis direction LD3 of the film plane shape of the free layer 334 is parallel to the Y-axis direction and a long axis direction LD4 of the film plane shape of the pinned layer 332 is not parallel to the Y-axis direction, whereas in the first embodiment, the long axis direction LD1 of the film plane shape of the free layer 134 is not parallel to the Y-axis direction and the long axis direction LD2 of the film plane shape of the pinned layer 132 is parallel to the Y-axis direction. The materials and functions of the free layer 334 and the pinned layer 332 of the in-plane magnetized spin-orbit magnetic device 300 are the same as the materials and functions of the free layer 134 and the pinned layer 132 of the in-plane magnetized spin-orbit magnetic device 100 in the aforementioned embodiment. A magnetic torque vector 352 of the pinned layer 332 is parallel to an anneal direction 362 in the semiconductor manufacturing process. A magnetic torque vector 351 of the free layer 334 is parallel to the long axis direction LD3 of the film plane shape of the free layer 334.

A positive preset angle θ is present between the long axis directions LD1 and LD3 of the film plane shapes of the free layers 134 and 334 and the long axis directions LD2 and LD4 of the film plane shapes of the pinned layers 132 and 332 in both the first and second embodiments. That is, the long axis directions LD1 and LD3 are located on the left side of the long axis directions LD2 and LD4 respectively. Those applying the various embodiments of the disclosure may also set a negative preset angle θ between the long axis directions LD1 and LD3 of the film plane shapes of the free layers 134 and 334 and the long axis directions LD2 and LD4 of the film plane shapes of the pinned layers 132 and 332 in the first and second embodiments. That is, in other embodiments, the long axis directions LD1 and LD3 may be located on the right side of the long axis directions LD2 and LD4 respectively. That is, the long axis direction LD1 of the film plane shape of the free layer 134 and the long axis direction LD2 of the film plane shape of the pinned layer 132 in the first embodiment may be replaced with each other; and in the second embodiment, the long axis direction LD3 of the film plane shape of the free layer 334 and the long axis direction LD4 of the film plane shape of the pinned layer 332 may be replaced with each other. Accordingly, another embodiment meeting the spirit of the disclosure is rendered by adjusting the angle in the structure of the film plane shapes of the free layer 134 and the pinned layer 132.

The film plane shapes of the free layers 134 and 334 in the first embodiment and the second embodiment are both capsule shapes. Those applying this embodiment may also design the film plane shapes of the free layers 134 and 334 in the first and second embodiments to be ellipses.

Figure 4A:
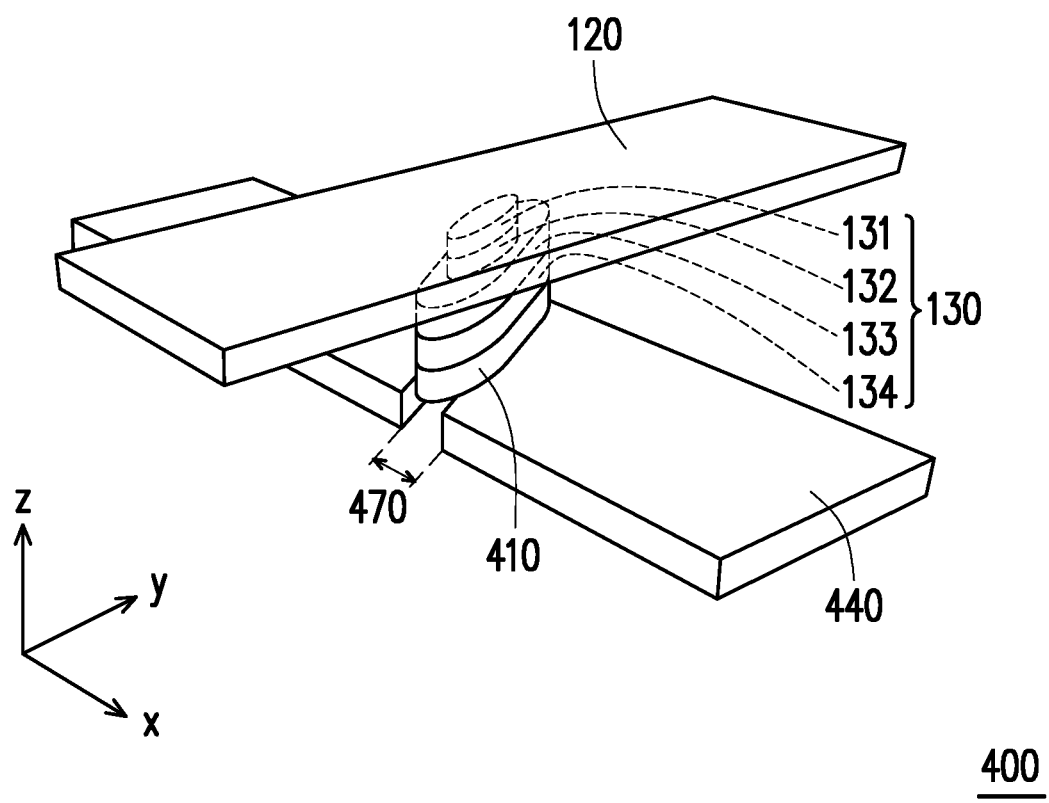
FIG. 4A is a schematic view of a structure of an in-plane magnetized spin-orbit magnetic device according to a third embodiment of the disclosure.
Figure 4B:
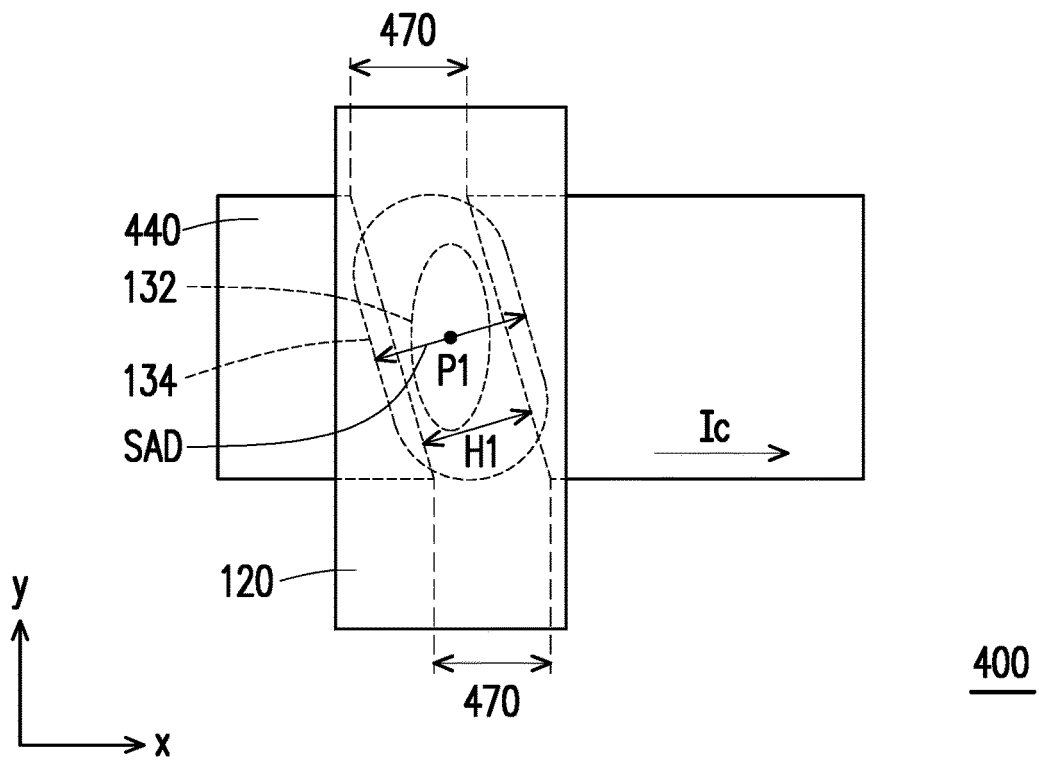
FIG. 4B is a top view of the structure of the in-plane magnetized spin-orbit magnetic device in FIG. 4A.
Figure 4C:
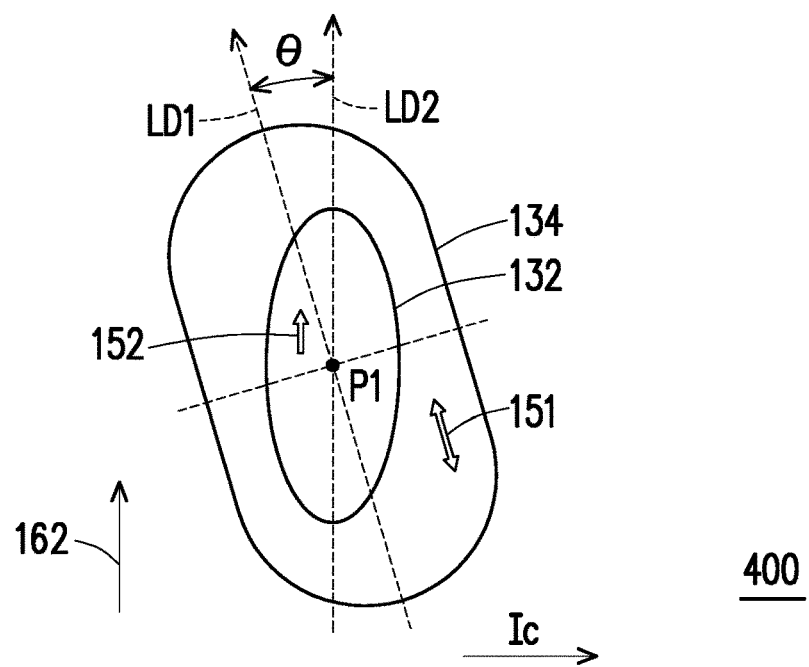
FIG. 4C is a schematic view of film plane shapes of a pinned layer and a free layer in FIG. 4A.
Figure 5:
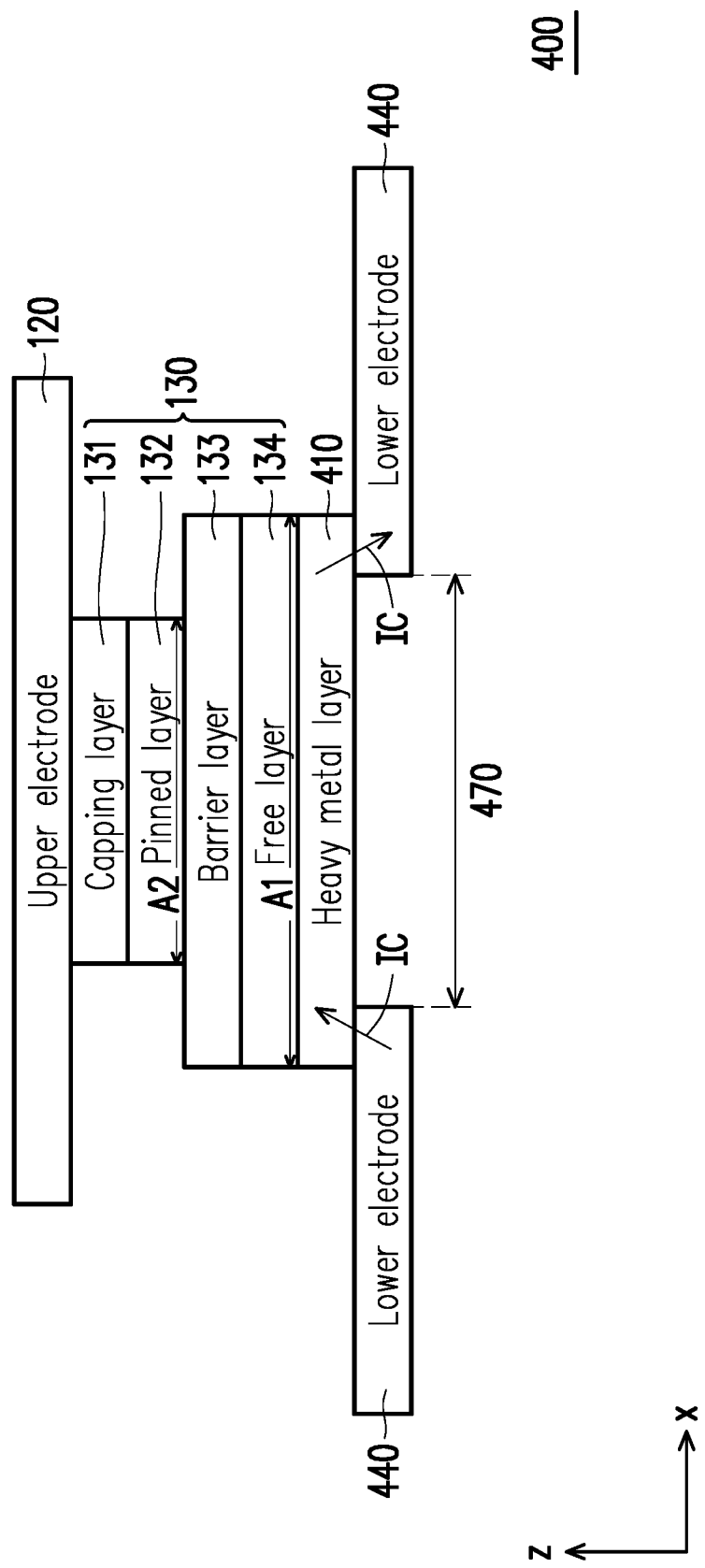
FIG. 5 is a side view of the structure of the in-plane magnetized spin-orbit magnetic device according to the third embodiment and a fourth embodiment of the disclosure.

FIGS. 4A to 4C and FIG. 5 are used hereafter to explain a third embodiment of the disclosure. FIG. 4A is a schematic view of a structure of an in-plane magnetized spin-orbit magnetic device 400 according to the third embodiment of the disclosure. FIG. 4B is a top view of a structure of the in-plane magnetized spin-orbit magnetic device 400 in FIG. 4A. FIG. 4C is a schematic view of film plane shapes of the pinned layer 132 and the free layer 134 in FIG. 4A. The components labeled with same reference numbers in the first embodiment and the third embodiment are the same. That is, these components have the same materials and functions. The third embodiment mainly differs from the first embodiment in that a heavy metal layer 410 and the free layer 134 of the in-plane magnetized spin-orbit magnetic device 400 have the same film plane shape and film plane area, and the in-plane magnetized spin-orbit magnetic device 400 further includes lower electrodes 440. In the semiconductor manufacturing process, the heavy metal layer 410 and the free layer 134 may be etched at the same time, so that the heavy metal layer 410 and the free layer 134 have a same film plane shape and film plane area. The material and function of the heavy metal layer 410 of the in-plane magnetized spin-orbit magnetic device 400 are the same as those of the heavy metal layer 110 of the in-plane magnetized spin-orbit magnetic device 100 in the aforementioned embodiment.

The lower electrodes 440 are disposed below the heavy metal layer 410. Two lower electrodes 440 are respectively disposed on opposite sides of the heavy metal layer 410. The lower electrodes 440 of this embodiment include an opening 470. The opening 470 is disposed below the heavy metal layer 410. A width H1 of the opening 470 in a direction parallel to a short axis SAD of the heavy metal layer 410 is smaller than a length of the short axis SAD of a film plane shape of the heavy metal layer 410. The width of the opening 470 is smaller than a short axis width of a film plane shape of the free layer 134 and the heavy metal layer 410. An extending direction of the opening 470 is parallel to the long axis direction LD1 of the film plane shape of the free layer 134 (as shown in FIG. 4B and FIG. 4C). A material of the lower electrode 440 is a conductive material. For example, the material of the lower electrode may be copper (Cu), aluminum (Al), tantalum (Ta), or an alloy of a combination of Cu, Al, and Ta. The thickness of the lower electrodes 440 in this embodiment may be 1 kilo Angstrom (kA) to 6 kilo Angstroms (kA), and those applying this embodiment may adjust the thickness of the lower electrode 440 according to their needs. Therefore, the input current Ic flows through the heavy metal layer 410 from one end of the lower electrode 440 and reaches another end of the lower electrode 440, thereby realizing a function of the heavy metal layer 410.

The structure of each of the layers shown in the side view is the same, so FIG. 2 is used again as the side view of the in-plane magnetized spin-orbit magnetic device 300.

Figure 6A:
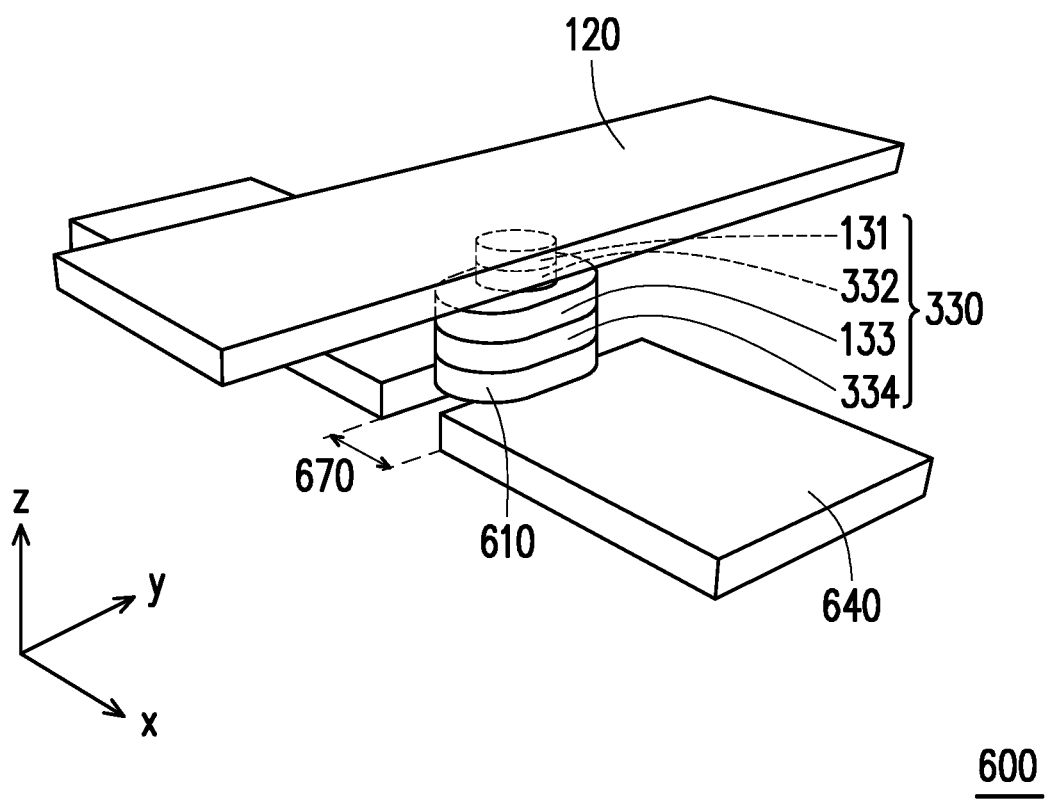
FIG. 6A is a schematic view of the structure of the in-plane magnetized spin-orbit magnetic device according to the fourth embodiment of the disclosure.
Figure 6B:
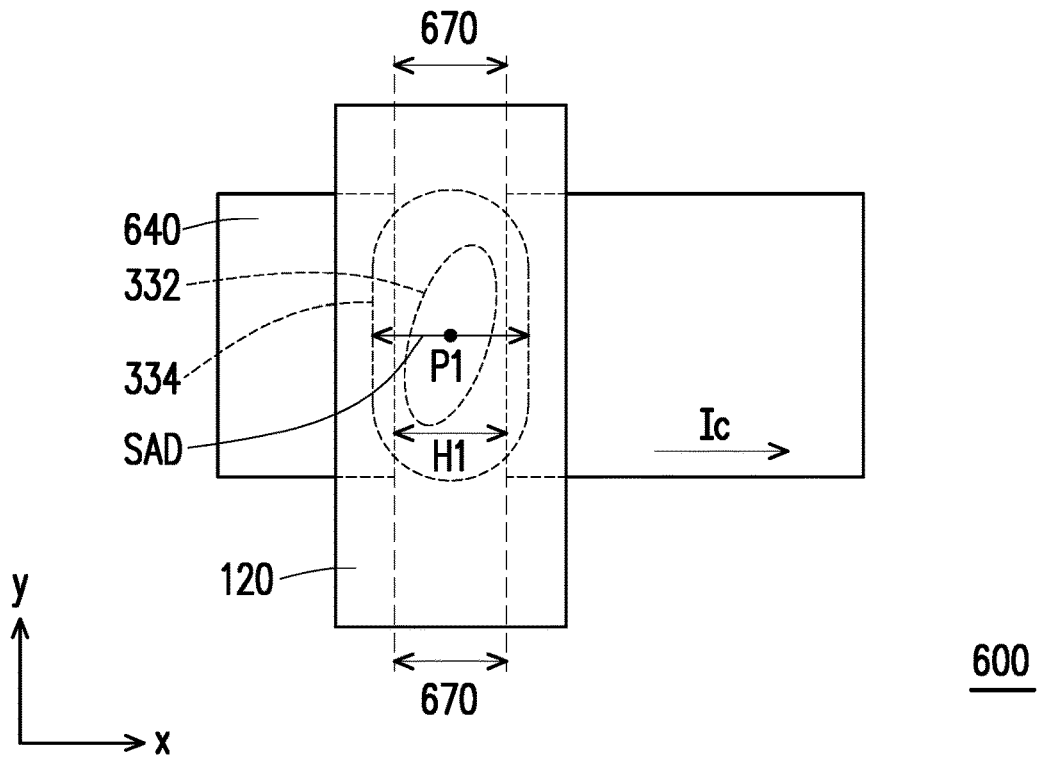
FIG. 6B is a top view of the structure of the in-plane magnetized spin-orbit magnetic device in FIG. 6A.
Figure 6C:
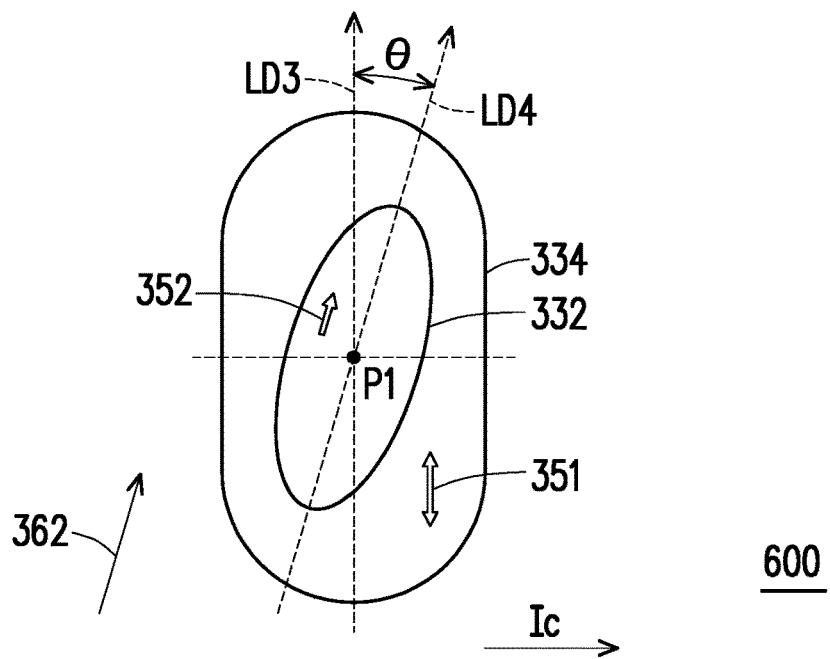
FIG. 6C is a schematic view of film plane shapes of a pinned layer and a free layer in FIG. 6A.

A fourth embodiment of the disclosure is described with FIG. 5 and FIGS. 6A to 6C hereafter. The respective layers of the in-plane magnetized spin-orbit magnetic device 400 of the third embodiment and the respective layers of an in-plane magnetized spin-orbit magnetic device 600 of the fourth embodiment have same structures in the side view, so FIG. 5 is used again as the side view of the in-plane magnetized spin-orbit magnetic device 600. FIG. 6A is a schematic view of a structure of the in-plane magnetized spin-orbit magnetic device 600 according to the fourth embodiment of the disclosure. FIG. 6B is a top view of the structure of the in-plane magnetized spin-orbit magnetic device 600 in FIG. 6A. FIG. 6C is a schematic view of film plane shapes of the pinned layer 332 and the free layer 334 in FIG. 6A.

Materials and functions of components of the respective layers in the second embodiment and the fourth embodiment are the same. The fourth embodiment differs from the second embodiment in that a heavy metal layer 610 and the free layer 334 of the in-plane magnetized spin-orbit magnetic device 600 have the same film plane shape and film plane area, and the in-plane magnetized spin-orbit magnetic device 600 further includes lower electrodes 640. In the semiconductor manufacturing process, the heavy metal layer 610 and the free layer 334 may be etched at the same time, so that the heavy metal layer 610 and the free layer 334 have a same film plane shape and film plane area. The materials and functions of the heavy metal layer 610 of the in-plane magnetized spin-orbit magnetic device 600 are the same as the heavy metal layer 110 of the in-plane magnetized spin-orbit magnetic device 100 in the aforementioned embodiment.

The lower electrodes 640 are disposed below the heavy metal layer 610. Two lower electrodes 640 are respectively disposed on the opposite sides of the heavy metal layer 610. The lower electrodes 640 of this embodiment include an opening 670. The opening 670 is disposed below the heavy metal layer 610. A width of the opening 670 in a corresponding direction parallel to the short axis SAD of the heavy metal layer 610 is smaller than the length of the short axis SAD of the film plane shape of the heavy metal layer 610. An extending direction of the opening 670 is parallel to the long axis direction LD3 of the film plane shape of the free layer 334 (as shown in FIGS. 6B and 6C). The materials and functions of the heavy metal layer 610 and the lower electrode 640 of the in-plane magnetized spin-orbit magnetic device 600 are the same as the heavy metal layer 410 and the lower electrode 440 of the in-plane magnetized spin-orbit magnetic device 400 in the third embodiment.

A positive preset angle θ is present between the long axis directions LD1 and LD3 of the film plane shapes of the free layers 134 and 334 and the long axis directions LD2 and LD4 of the film plane shapes of the pinned layers 132 and 332 in both the third and fourth embodiments. That is, the long axis directions LD1 and LD3 are located on the left side of the long axis directions LD2 and LD4 respectively. Those applying the various embodiments of the disclosure may also set a negative preset angle θ between the long axis directions LD1 and LD3 of the film plane shapes of the free layers 134 and 334 and the long axis directions LD2 and LD4 of the film plane shapes of the pinned layers 132 and 332 in the third and fourth embodiments. That is, in other embodiments, the long axis directions LD1 and LD3 may be located on the right side of the long axis directions LD2 and LD4 respectively. That is, the long axis direction LD1 of the film plane shape of the free layer 134 in the third embodiment and the long axis direction LD2 of the film plane shape of the pinned layer 132 may be replaced with each other; in the fourth embodiment, the long axis direction LD3 of the film plane shape of the free layer 334 and the long axis direction LD4 of the film plane shape of the pinned layer 332 may be replaced with each other. Accordingly, another embodiment meeting the spirit of the disclosure is rendered by adjusting the angle in the structure of the film plane shapes of the free layer 134 and the pinned layer 132.

The film plane shapes of the free layers 134 and 334 in the third embodiment and the fourth embodiment are both capsule shapes. Those applying this embodiment may also design the film plane shapes of the free layers 134 and 334 in the third and fourth embodiments to be ellipses.

Figure 7:
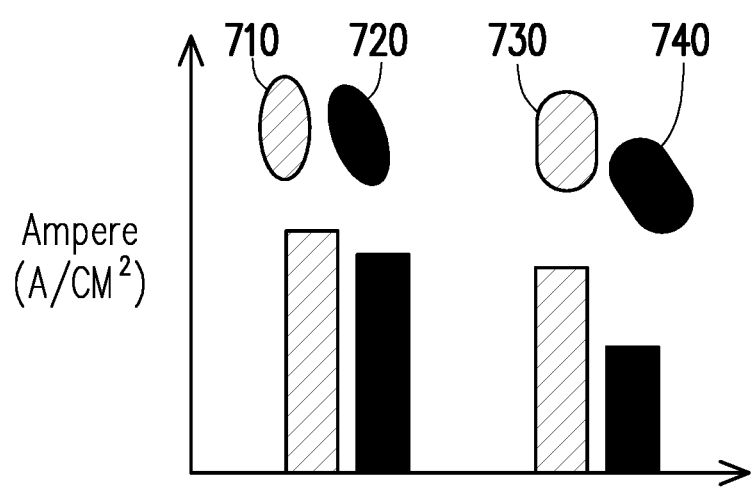
FIG. 7 is a schematic diagram illustrating shapes of a free layer when a film plane shape of a pinned layer is an ellipse and currents input to a heavy metal layer after a preset angle is adjusted in an embodiment of the disclosure.

FIG. 7 is a schematic diagram illustrating the shapes of the free layer when the film plane shape of the pinned layer is an ellipse and currents input to the heavy metal layer after a preset angle is adjusted in the embodiment of the disclosure. FIG. 7 shows results of simulating at an absolute temperature (T) of 300K.

The vertical axis of FIG. 7 represents the values of amperes (A) per square centimeter indicating how many amperes the input current in the heavy metal layer needs to reach to enable the magnetic torque vector in the free layer to undergo the magnetization reversal. Reference number 710 in FIG. 7 indicates how many amperes the input current in the heavy metal layer should reach to enable the magnetic torque vector in the free layer to undergo the magnetization reversal when there is no preset angle θ (that is, when the preset angle θ is zero degrees) and when the film plane shapes of the pinned layer and the free layer are both designed to be ellipses. Reference number 720 in FIG. 7 indicates how many amperes the input current in the heavy metal layer should reach to enable the magnetic torque vector in the free layer to undergo the magnetization reversal when there is the preset angle θ (for example, when the preset angle θ is 10 degrees) and when the film plane shapes of the pinned layer and the free layer are both designed to be ellipses. Reference number 730 in FIG. 7 indicates how many amperes the input current in the heavy metal layer should reach to enable the magnetic torque vector in the free layer to undergo the magnetization reversal when there is no preset angle θ (that is, when the preset angle θ is zero degrees) and when the film plane shape of the pinned layer is designed to be the ellipse and the film plane shape of the free layer is designed to be the capsule shape. Reference number 740 in FIG. 7 indicates how many amperes the input current in the heavy metal layer should reach to enable the magnetic torque vector in the free layer to undergo the magnetization reversal when there is the preset angle θ (for example, when the preset angle θ is 10 degrees) and when the film plane shape of the pinned layer is designed to be the ellipse and the film plane shape of the free layer is designed to be the capsule shape.

As shown in FIG. 7, the amperes of the input current required by the heavy metal layer when the preset angle θ is 10 degrees, as represented by the reference numbers 720 and 740, are both lower than the amperes of the input current required by the heavy metal layer when there is no preset angle θ (the preset angle θ is zero degrees), as represented by the reference numbers 710 and 730.

In summary, in the in-plane magnetized spin-orbit magnetic device according to the embodiments of the disclosure, by designing the film plane shape of the free layer in the magnetic tunnel junction to be an ellipse or a capsule shape, the film plane shape of the pinned layer to be an ellipse, and the film plane of the free layer to be larger than the film plane of the pinned layer, and providing the preset angle between the long axis directions of the film plane shapes of the free layer and the pinned layer, the magnetic torque of the free layer can be adjusted more easily due to influence of the spin-orbit torque. In other words, with the anisotropy between the film plane shape of the pinned layer and the free layer and the anneal direction of the free layer and the pinned layer in the semiconductor manufacturing process set as the long axis direction of the film plane shape of the pinned layer, the spin-orbit torque provides an additional lateral torque to the magnetic torque vector of the free layer, and the difficulty of the magnetization reversal of the magnetic torque of the free layer is thus reduced slightly. In other words, the magnetic torque of the free layer according to the embodiments of the disclosure is more susceptible to the spin-orbit torque caused by the current of the heavy metal layer and undergo the magnetization reversal, so a magnitude of the write current in the heavy metal layer may be reduced, thereby saving power.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An in-plane magnetized spin-orbit magnetic device, comprising:
a heavy metal layer;
an upper electrode; and
a magnetic tunnel junction which is disposed between the heavy metal layer and the upper electrode,
wherein the magnetic tunnel junction comprises:
a free layer disposed on the heavy metal layer, wherein the free layer has a first film plane area; and
a pinned layer disposed on the free layer, wherein the pinned layer has a second film plane area,
wherein a preset angle is present between a long axis direction of a film plane shape of the free layer and a long axis direction of a film plane shape of the pinned layer, and the first film plane area is larger than the second film plane area,
wherein the in-plane magnetized spin-orbit magnetic device further comprises:
lower electrodes disposed below the heavy metal layer, wherein the lower electrodes are respectively disposed on opposite sides of the heavy metal layer,
wherein the lower electrodes comprise an opening, the opening is disposed below the heavy metal layer, a width of the opening in a corresponding direction parallel to a short axis of the heavy metal layer is smaller than a length of a short axis of a film plane shape of the heavy metal layer, and an extending direction of the opening is parallel to a long axis direction of the film plane shape of the free layer.

2. The in-plane magnetized spin-orbit magnetic device according to claim 1, wherein the film plane shape of the free layer is either an ellipse or a capsule shape.

3. The in-plane magnetized spin-orbit magnetic device according to claim 2, wherein the film plane shape of the pinned layer is an ellipse.

4. The in-plane magnetized spin-orbit magnetic device according to claim 1, further comprising:
a barrier layer disposed between the free layer and the pinned layer.

5. The in-plane magnetized spin-orbit magnetic device according to claim 4, wherein a material of the barrier layer is magnesium oxide, aluminum oxide, or a combination of magnesium oxide and aluminum oxide.

6. The in-plane magnetized spin-orbit magnetic device according to claim 1, further comprising:
a capping layer disposed between the upper electrode and the pinned layer.

7. The in-plane magnetized spin-orbit magnetic device according to claim 1, wherein a material of the lower electrode is copper (Cu), aluminum (Al), tantalum (Ta) or an alloy of a combination of Cu, Al, and Ta.

8. The in-plane magnetized spin-orbit magnetic device according to claim 1, wherein the heavy metal layer and the free layer have the same film plane area and film plane shape.

9. The in-plane magnetized spin-orbit magnetic device according to claim 1, wherein etching is performed on the heavy metal layer and the free layer at a same time in a semiconductor manufacturing process.

10. The in-plane magnetized spin-orbit magnetic device according to claim 1, wherein the heavy metal layer obtains an input current through an electrode contact to generate a spin current, so that a magnetization reversal of the magnetic tunnel junction occurs,
wherein a material of the heavy metal layer is tantalum (Ta), platinum (Pt), tungsten (W), or an alloy of a combination of Ta, Pt, and W.

11. The in-plane magnetized spin-orbit magnetic device according to claim 1, wherein a material of the free layer is a ferromagnetic material with horizontal anisotropy, and a magnetic torque vector of the free layer is in an arrangement parallel to the film plane.

12. The in-plane magnetized spin-orbit magnetic device according to claim 1, wherein a material of the pinned layer is a ferromagnetic material with an in-plane magnetic torque, and a magnetic torque vector of the pinned layer is in an arrangement parallel to the film plane.

13. The in-plane magnetized spin-orbit magnetic device according to claim 1, wherein a material of the pinned layer is iron (Fe), cobalt (Co), nickel (Ni), gadolinium (Gd), terbium (Tb), dysprosium (Dy), boron (B), or an alloy of a combination of Fe, Co, Ni, Gd, Tb, Dy, and B.

14. The in-plane magnetized spin-orbit magnetic device according to claim 1, wherein the preset angle is not equal to 90 degrees.

15. The in-plane magnetized spin-orbit magnetic device according to claim 1, wherein an absolute value of the preset angle is greater than zero degree and less than 45 degrees.

16. The in-plane magnetized spin-orbit magnetic device according to claim 1, wherein an anneal direction of the pinned layer in a semiconductor manufacturing process for manufacturing the in-plane magnetized spin-orbit magnetic device is the same as the long axis direction of the film plane shape of the pinned layer.

* * * * *